United States Patent [19]

Inoue et al.

[11] Patent Number: 4,931,365
[45] Date of Patent: Jun. 5, 1990

[54] AROMATIC POLYIMIDE FILM HAVING METALLIC SURFACE

[75] Inventors: Hiroshi Inoue; Tetsuji Hirano, both of Hirakata, Japan

[73] Assignee: Ube Industries, Ltd., Ube, Japan

[21] Appl. No.: 196,316

[22] Filed: May 20, 1988

[30] Foreign Application Priority Data

May 22, 1987 [JP] Japan ................................ 62-125354

[51] Int. Cl.$^5$ ........................ B32B 15/08; B32B 27/08
[52] U.S. Cl. ................................ 428/458; 428/473.5; 428/901
[58] Field of Search ............ 428/901, 458, 207, 473.5, 428/328, 374; 528/28, 423

[56] References Cited

U.S. PATENT DOCUMENTS

| | | | |
|---|---|---|---|
| 3,886,119 | 5/1975 | D'Alelio | 528/28 X |
| 4,277,583 | 7/1981 | Waitkus et al. | 525/423 |
| 4,359,414 | 11/1982 | Mastrangelo | 428/328 X |
| 4,543,295 | 9/1985 | St. Clair et al. | 428/458 |
| 4,699,841 | 10/1987 | Kundinger et al. | 428/379 X |
| 4,725,504 | 2/1988 | Knudsen et al. | 428/458 |
| 4,810,563 | 3/1989 | DeGree et al. | 428/901 X |

*Primary Examiner*—Thomas J. Herbert
*Attorney, Agent, or Firm*—Frishauf, Holtz, Goodman & Woodward

[57] ABSTRACT

An aromatic polyimide film having a metallic surface comprises a substrate film of an aromatic polyimide containing essentially no inorganic particle, an aromatic polyimide resin layer containing non-conductive metal oxide particles dispersed therein and a metal layer, superposed in order. A portion of the non-conductive metal oxide particles located in the vicinity of the surface of the aromatic polyimide resin layer is reduced into metal so that the surface of the resin layer is made electroconductive.

15 Claims, 1 Drawing Sheet

AROMATIC POLYIMIDE FILM HAVING METALLIC SURFACE

BACKGROUND OF THE INVENTION

1. Field of the Invention

The present invention relates to an aromatic polyimide film having an electroconductive metallic surface and a process for the preparation of the same. More particularly, the invention relates to an aromatic polyimide film having a conductive metallic surface which is suitably employed as a circuit printable film which is used for the production of a print circuit board and a process for the preparation of the same.

2. Description of Prior Art

As a circuit printable film having a substrate of an aromatic polyimide which has high heat resistance, a film of three-layer structure (i.e., three-layer film composite) comprising an aromatic polyimide film, an adhesive layer and a metallic copper layer, superposed in order, has been conventionally employed. In this structure, however, when the current is passed in the formed circuit in a fine pattern, the adhesive layer tends to deteriorate because of its low heat resistance, resulting in decrease of adhesion strength.

In view of the above-mentioned problem, a method of directly providing a metal layer on the surface of a resin film without using an adhesive layer has been proposed. For example, Japanese Patent Provisional Publications No. 58(1983)-122939, No. 60(1085)-36666 and No. 60(1985)-36667 disclose a process comprising the steps of preparing a film substrate containing non-conductive metal oxide particles, reducing the surface of the film to convert into a conductive surface, and forming a metal layer on the conductive surface through an electrolytic process.

The employment of the above-mentioned process makes it possible to form a metal layer on a resin film without using an adhesive layer. However, the film composite having a metallic surface obtained by the process is essentially charged with a large amount of metal oxide particles, so that the film composite tends to lower in the mechanical strength and the flexibility. For avoiding these drawbacks, it is considered to decrease the amount of the metal oxide particles to be contained in the film. However, if the amount of the metal oxide particles is reduced, there arises other problem that a metal layer of uniform thickness can be hardly formed on the surface of the film.

SUMMARY OF THE INVENTION

It is an object of the present invention to provide an aromatic polyimide film having a conductive metallic surface which has remarkably high adhesion (bonding) strength between the aromatic polyimide substrate and the metal layer and is improved in various physical properties such as heat resistance, mechanical strength and flexibility.

Particularly, the present invention has an object to provide an aromatic polyimide film having an electroconductive metallic surface which is suitably employed as a circuit printable film.

There is provided by the present invention an aromatic polyimide film having a metallic surface thereon comprising a substrate film made of an aromatic polyimide containing essentially no inorganic particle, an aromatic polyimide resin layer containing non-conductive metal oxide particles dispersed therein, and a metal layer, superposed in order, a portion of said non-conductive metal oxide particles located in the vicinity of the surface of the aromatic polyimide resin layer being so reduced into metal that the surface of said resin layer is made conductive.

The above-mentioned aromatic polyimide film having a metallic surface can be advantageously prepared by the process of the invention comprising the steps of:

(1) coating an aromatic polyamic acid solution containing metal oxide particles in an amount of 20 to 80% by weight in dry basis (which is an amount per total amount of the resinous component and the metal oxide particles) over at least one surface of a film of an aromatic polyimide or an aromatic polyamic acid which is a precursor of the aromatic polyimide, said film containing an organic solvent in an amount of not less than 10% by weight;

(2) heating the film with the coated layer to obtain a film composite comprising an aromatic polyimide film and an aromatic resin polyimide layer containing metal oxide particles provided on at least one surface of the aromatic polyimide film;

(3) treating the film composite with a reducing agent to reduce the metal oxide particles in the vicinity of the surface of the film composite (or "on the exposed surface of the film composite") so as to provide conductivity to the surface of the film composite; and (4) forming a metal layer on the conductive surface of the film composite through an electrolytic process or an electrochemical process.

The aromatic polyimide film having a metallic surface according to the present invention shows an extremely high adhesion (or bonding) strength between the metal layer and the polyimide layer. Further, the surface of the aromatic polyimide film of the invention has such sufficient conductivity that a metal layer of large thickness can be formed thereon through an electrolytic process which is optionally performed in the later stage.

Furthermore, the aromatic polyimide film having a metallic surface of the invention is improved in various necessary properties such as tensile strength and mechanical strength as well as heat resistance. Hence, the aromatic polyimide film of the present invention is very useful as a circuit printable film or for the use in other fields of art.

DETAILED DESCRIPTION OF THE INVENTION

Figure 1:
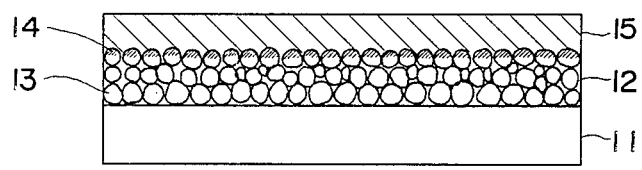
FIG. 1 shows a schematic section view of an aromatic polyimide film having metallic surface according to the present invention.

The aromatic polyimide film of the invention has, for instance, a section illustrated in FIG. 1, wherein 11 indicates a substrate film, 12 indicates a polyimide layer containing metal oxide particles 13 in which a portion 14 of the metal oxide particles located in the vicinity of the surface of the layer is reduced to turn into metal, and 15 indicates a metal layer.

In the present invention, a substrate film of an aromatic polyimide or its precursor, namely, an aromatic polyamic acid, contains an organic solvent which is used in the above step (1) in an amount of not less than 10% by weight, preferably 15 to 70% by weight. The substrate film preferably is a film made of an aromatic polyamic acid which is prepared from an aromatic tetracarboxylic acid component and an aromatic diamine component in an organic solvent. The film of the aromatic polyimide or the aromatic polyamic acid which contains the above-mentioned solvent can be prepared by a variety of known methods.

As the aromatic tetracarboxylic acid components employable for synthesizing the above-described aromatic polyamic acid, there can be mentioned aromatic tetracarboxylic acids, acid anhydrides thereof, salts thereof and esters thereof. Preferred are acid anhydrides of the aromatic tetracarboxylic acid. Examples of the aromatic tetracarboxylic acids include 3,3',4,4'-biphenyltetracarboxylic acid, 2,2',3,3'-biphenyltetracarboxylic acid, 2,3,3',4'-biphenyltetracarboxylic acid, 3,3',4,4'-benzophenonetetracarboxylic acid, bis(3,4-dicarboxyphenyl)-methane, 2,2-bis(3,4-dicarboxyphenyl)propane, bis(3,4-dicarboxyphenyl)thioether, bis(3,4-dicarboxyphenyl)-sulfone, 2,3,6,7-naphthalenetetracarboxylic acid, and pyromellitic acid.

Examples of the aromatics diamine components also employable for synthesizing the above-mentioned aromatic polyamic acid include 4,4'-diaminodiphenyl ether, 4,4'-diaminodiphenylmethane, 4,4'-diaminodiphenylpropane, benzidine, 3,3'-dimethylbenzidine, 4,4'-diaminodiphenylsulfide, 4,4'-diaminodiphenylsulfone, methaphenylenediamine, paraphenylenediamine, 3,3'-diaminodiphenylmethane, 3,3'-diaminodiphenylpropane, 3,3'-diaminodiphenylsulfide, and 3,3'-diaminodiphenylsulfone.

The above-mentioned aromatic tetracarboxylic acid component and aromatic diamine component can be used alone, respectively. Otherwise, any one of those components can be employed in combination, or both of those components can be employed in combination, respectively.

As the aforementioned organic solvent, any solvent can be employed in the invention, provided that the solvent homogeneously dissolves the aforementioned polyamic acid in an amount of not less than approx. 40% by weight. Examples of the organic solvents include N,N-di(lower)alkylcarboxylamides such as N,N-dimethylacetamide, N,N-diethylacetamide, N,N-dimethylformamide, and N,N-diethylformamide, N-methyl-2-pyrrolidone, dimethylsulfoxide, diethylsulfoxide, dimethylsulfone, diethylsulfone, and hexamethylsulfolamide.

Various processes are already known for preparing an aromatic polyamic acid from an aromatic tetracarboxylic acid component and an aromatic diamine component in an organic solvent, and the known processes can be also used for the preparation of the polyamic acid employable in the invention.

There is no specific limitation on the process for forming a film from the above-mentioned polyamic acid. For example, a polyamic acid solution containing the above-mentioned polyamic acid homogeneously dissolved in the aforementioned organic solvent or a polyamic acid solution containing an imidation agent for ring closure of an amic acid to convert into an imide group is cast over a belt or a roll, and then the cast solution is heated at a temperature of not higher than 200° C. to distill off a portion or most of the solvent from the resulting film so as to form a self-supporting film. Otherwise, an imidation reaction is made in the cast solution as well as performing the evaporation of the solvent under heating to form a self-supporting film. Thus, a self-supporting film containing the solvent in an amount of not less than 10% by weight based on the film weight can be prepared.

On at least one surface of the obtained film is then coated an aromatic polyamic acid solution containing metal oxide particles in an amount of 20 to 80% by weight (i.e., weight in the dried product).

The aromatic polyamic acid solution containing metal oxide particles can be prepared by incorporating non-conductive metal oxide particles into the aforementioned polyamic acid solution. Alternatively, other polyamic acids than the aforementioned one can be also employed for preparing the aromatic polyamic acid solution containing metal oxide particles.

The non-conductive metal oxide employable in the invention preferably are in the form of very fine particles, and their mean particle size is preferably in the range of 0.1 to 5 μm. The metal oxide is generally used in an amount of 20 to 80% by weight, preferably 30 to 60% by weight, based on the solid amount of the aromatic polyamic acid solution containing the metal oxide.

Examples of the metal oxides include copper(I) oxide, nickel(II) oxide, cobalt(II) oxide, lead(II) oxide, cadmium(II) oxide, chromium(III) oxide, tin(IV) oxide, antimony(III) oxide and other metal oxides. Preferably employed in the invention is copper(I) oxide.

The metal oxide particles is preferred to be homogeneously dispersed in the solution. There is no specific limitation on the method for dispersing the metal oxide particles in the solution, and for example, a method of continuous dispersing using an ultrasonic dispersing apparatus and a turbine impeller mixer of liner-1 type can be employed.

The polyamic acid solution containing metal oxide particles prepared as above is coated over the aforementioned substrate film in such a manner that the coated layer would have a thickness (dry thickness) of not smaller than 0.5 μm, preferably in the range of 1 to 30 μm. The polyamic acid solution can be coated on one surface or both surfaces of the film.

As described hereinbefore, the polymer in the substrate film and in the coated layer of the polyamic acid solution containing metal oxide particles may be the same as each other or different from each other. Further, the components and the solvents used for the preparation of the coating solution and the substrate film may be the same as each other or different from each other.

In the present invention, the process for coating the polyamic acid solution containing metal oxide particles over the substrate film is by no means restricted to a specific one, and a variety of known processes such as processes of gravure coating, silk screening and dip coating can be employed.

The substrate film having the coated layer thereon (i.e., film composite) obtained as above is then subjected to heat treatment. The heat treatment is preferably done by initially heating the film composite at a temperature in the range of 50° to 200° C. (i.e., primary heating) and then further heating at a temperature of not lower than 150° C., preferably in the range of 180° to 500° C., (i.e., secondary heating), to remove the solvent by evaporation or to perform an imidation reaction of the amic acid as well as evaporation of the solvent.

The heat treatment can be carried out using various known heating apparatuses such as a hot air oven and an infrared rays-heating oven. The secondary heating may be performed as an one-stage heating without varying the temperature or as a plural-stage heating with varying the temperature, for example, comprising heating the film composite at a temperature of about 200° C. and then further heating at a temperature of about 400° C.

Subsequently, the surface of the aromatic polyimide film composite of two or three-layer structure prepared as above is treated with a reducing agent to reduce the metal oxide particles into metal, whereby the surface of the film composite is converted to a conductive surface. The reduction treatment is preferably carried out in such a manner that the surface of the film composite shows a surface resistance of 0.01 to $10^3$ ohm. In the reduction procedure, it is not necessarily required that the whole particle of the metal oxide is reduced into metal, and it is enough that at least the surface of the metal oxide particle is reduced into metal.

Prior to the treatment with the reducing agent, it is preferred to draw the film composite or to abrade the surface of the film composite in order to sufficiently expose the metal oxide particles to outside, whereby the above-described reduction reaction can readily proceed. However, in some cases, the reduction reaction proceeds without specifically having subjected the film composite to the drawing procedure or the abrading procedure.

The method for drawing or abrading the film composite is by no means restricted to a specific one. However, in the case of abrading the surface of the film composite, it is required to uniformly abrade the surface of the metal oxide-containing layer.

As the reducing agent employable in the invention, any reducing agent can be employed, provided that the reducing agent reduces the metal oxide into metal. Particularly preferred is a borohydride. The borohydride includes not only an unsubstituted borohydride but also a substituted borohydride. For example, there can be employed a substituted borohydride in which three or more hydrogen atoms of the borohydride ions are substituted by inert substituent groups such as an alkyl group, an aryl group and an alkoxy group. Preferably preferred are alkali borohydrides in which the alkali metal is sodium or potassium. Examples of the alkali borohydrides include sodium borohydride, potassium borohydride, sodium diethylborohydride, sodium trimethoxyborohydride and sodium triphenylborohydride.

The reduction treatment can be easily performed by contacting the film composite with a borohydride solution. With respect to the concentration of the borohydride solution, the active hydrogen of the borohydride is preferably in the range of 0.05 to 1% by weight based on the weight of the solution. In some cases, the reduction reaction is advantageously promoted in a buffering medium, whereby a desired reduction speed can be obtained. The buffering medium may contain various accelerators such as acids or metal chlorides to appropriately control the reduction speed. Examples of the acids include boric acid, oxalic acid, and citric acid, and examples of the metal chlorides include chlorides of cobalt(II), nickel(II), manganese(II), iron(II) and copper(II).

After the reduction procedure is complete, the film composite is subjected to a washing procedure.

On the surface of the film composite having been subjected to the reduction treatment is finally formed a metal layer such as a layer of copper, nickel or other metal. The formation of the metal layer can be done by an electrolytic process or an electrochemical process, but the former process is more preferably employed because the time required for the formation of the metal layer in this process is shorter than in the latter process.

There is no specific limitation on the electrolytic process employable in the invention, and a variety of conventional processes can be employed in the invention. For example, in the case of copper electroplating, the film composite having a reduced surface and a copper are dipped in an electrolytic solution (electrolyte) such as a cyan electrolyte or an electrolyte mainly containing sulfate, pyrophosphate or fluoroborate, and an electric current is applied to the electrolyte. The electrolyte may contain other additives such as a brightener, a buffering agent for preventing pH variation, and a dye leveling agent.

The film (i.e., film composite) obtained by the above-described process can be further provided with another thick metal layer by an additional electrolytic process. Otherwise, a circuit print board can be prepared using the obtained film by a process comprising the steps of coating a photoresist on the film, developing the photoresist, reinforcing the film through an electrolysis, then removing the photoresist from the film, and finally subjecting the film to an etching procedure.

The examples and the comparison example of the present invention are given below.

In each of the examples and the comparison example, the physical properties of the film are evaluated using a specimen having length of 30 mm and width of 5 mm.

EXAMPLE 1

3,3′,4,4′-Biphenyltetracarboxylic acid dianhydride and p-phenylenediamine were polymerized in N,N-dimethylacetamide (solvent) at 25° C. for one hour to prepare an aromatic polyamic acid solution [polymer concentration: 10 wt.%, viscosity at 25° C. (solution viscosity measured by a rotational viscometer): 50 poise]. The obtained aromatic polyamic acid solution was cast over a glass plate to form a thin film of uniform thickness. The thin film was heated at 100° C. for 10 minutes to prepare a self-supporting film containing the solvent in an amount of 35 wt.% based on the film weight and having thickness of 50 μm.

Independently, to 500 g. of an polyamic acid solution having been prepared in the same manner as described about was added 50 g. of copper(I) oxide particles under stirring of the solution, and the solution containing the copper(I) oxide particles was further stirred for one hr. to sufficiently disperse the copper(I) oxide in the solution. Thus, an aromatic polyamic acid solution containing metal oxide particles was prepared.

Subsequently, the obtained aromatic polyamic acid solution containing metal oxide particles was coated on one surface of the self-supporting film by means of a doctor blade. The film with the coated layer was subjected to a primary heating at 120° C. for 5 minutes and then subjected to a secondary heating comprising heating at 200° C. for 10 minutes and another heating at 420° C. for 5 minutes, to prepare an aromatic polyimide film of two-layer structure. The metal oxide particles-containing layer of the obtained film had thickness of 5 μm.

The obtained film of two-layer structure was slightly abraded with a water suspension of alumina on the metal oxide particles-containing layer side surface, and the film was washed with running water to remove the abrading agent. The abraded surface of the film was then deposited with a reducing compound containing potassium borohydride as a host component for 5 minutes to perform reduction reaction of the metal oxide. Thereafter, the film was washed with running water to remove the reducing compound, whereby the film had a glossy surface.

The reducing compound employed in the above was a compound having the following composition.

| Distilled water | 100 ml |
|---|---|
| Caustic soda | 0.5 g. |
| Sodium carboxymethyl cellulose | 5 g. |
| Potassium borohydride | 5 g. |

The glossy surface of the film had a resistance of approx. 100 ohm at two points of 5 cm distant from each other on the surface.

The conductive surface of the film was deposited with copper by means of an electrolytic process at 0.2 A/dm$^2$ for 15 minutes using an electrolyte having the following composition. Thus, a polyimide film having a glossy metallic surface was prepared.

| Composition of electrolyte | |
|---|---|
| Distilled water | 100 ml |
| Copper sulfate | 20 g. |
| Concentrated sulfuric acid | 0.5 ml |
| Thiourea | 10 mg. |
| Dextrin | 10 mg. |

In the above electrolytic process, the cathode was the film per se and the anode was copper. The thickness of the copper layer formed by the deposition through the electrolytic process was 5 μm.

The obtained polyimide film having a metallic surface showed the following excellent physical properties (values are according to ASTM D-882).

| Tensile strength: | 22.4 kg/mm$^2$ |
|---|---|
| Elongation: | 16% |
| Tensil Modulus: kg/mm$^2$ | |

EXAMPLE 2

The procedures of Example 1 were repeated except for varying the amine content in the metal oxide particles-containing polyamic acid solution to 4,4'-diaminodiphenyl ether, to prepare a polyimide film having a metallic surface and having a different composition of the coated layer of the solution from that of the polyimide film obtained in Example 1.

The obtained film had a glossy surface and showed the following excellent physical properties (values are according to ASTM D-882).

| Tensile strength: | 18.7 kg/mm$^2$ |
|---|---|
| Elongation: | 17% |
| Tensil Modulus: | 536 kg/mm$^2$ |

EXAMPLE 3

3,3',4,4'-Biphenyltetracarboxylic acid dianhydride and p-phenylenediamine were polymerized in N,N-dimethylacetoamide (solvent) at 25° C. for one hour to prepare an aromatic polyamic acid solution [polymer concentration: 10 wt.%, viscosity at 25° C. (solution viscosity measured by a rotational viscometer): 500 poise]. To the obtained aromatic polyamic acid solution were added 2.0 equivalents of acetic anhydride per an amic acid unit as an imidation agent for ring closure of the amic acid to form an imide group and 0.5 equivalent of isoquinoline per an amic acid unit as a catalyst. The solution was uniformly cast over a glass plate, and the cast solution on the glass plate was heated at 100° C. for 5 minutes, to prepare a self-supporting film containing the solvent in an amount of 45 wt.% based on the film weight.

The procedures of Example 1 were repeated except for using the above-obtained film as the self-supporting film, to prepare a polyimide film having a metallic surface.

The obtained film had a glossy surface and showed the following excellent physical properties (values are according to ASTM D-882).

| Tensile strength: | 20.3 kg/mm$^2$ |
|---|---|
| Elongation: | 13% |
| Tensil Modulus: | 589 kg/mm$^2$ |

COMPARISON EXAMPLE 1

3,3',4,4'-Biphenyltetracarboxylic acid dianhydride and p-phenylenediamine were polymerized in N,N-dimethylacetoamide (solvent) at 25° C. for one hour to prepare an aromatic polyamic acid solution [polymer concentration: 10 wt.%, viscosity at 25° C. (solution viscosity measured by a rotational viscometer): 500 poise]. To 500 g. of the solution was added 50 g. of copper(I) oxide particles under stirring of the solution, and the solution added with the copper(I) oxide was further stirred for one hour to sufficiently disperse the copper(I) oxide particles in the solution. Thus, an aromatic polyamic acid solution containing metal oxide particles was prepared.

Subsequently, the obtained aromatic polyamic acid solution containing metal oxide particles was uniformly cast over a glass plate, and the cast solution on the glass plate was subjected to a primary heating at 100° C. for 10 minutes, to prepare a self-supporting film containing the solvent in an amount of 35 wt.% based on the film weight. The film was then subjected to a secondary heating comprising heating at 200° C. for 10 minutes and another heating at 420° C. for 5 minutes, to prepare an aromatic polyimide film containing metal oxide particles.

One surface of the film containing metallic oxide particles obtained as above was then slightly abraded with a water suspension of alumina, and the film was washed with running water to remove the abrading agent. Thereafter, the film was subjected to a reduction procedure and an electrolytic procedure in the same manners as described in Example 1, to prepare a polyimide film having a glossy metallic surface.

The obtained film showed the following physical properties (values are according to ASTM D-882), and it was confirmed that the film was unsuitable for a circuit printable film from the viewpoint of mechanical strength.

| Tensile strength: | 0.5 kg/mm$^2$ |
|---|---|
| Elongation: | 0.1% |

We claim:

1. An aromatic polyimide film having a metallic surface thereon comprising a substrate film made of an aromatic polyimide containing essentially no inorganic particles, an aromatic polyimide resin layer containing non-conductive metal oxide particles dispersed therein, and a metal layer, superposed in order, wherein said aromatic polyimide resin layer is coated over the substrate film, a portion of said non-conductive metal oxide particles are present on the surface of the aromatic polyimide resin layer on the side in contact with the metal layer in such manner that the top portions of said particles on the surface are exposed and said exposed top portions of the particles are so reduced into metal that the surface of said resin layer is made conductive, and said metal layer is coated over the exposed conductive portions of the particles through an electrolytic process or an electrochemical process.

2. The aromatic polyimide film having a metallic surface, as claimed in claim 1, wherein said surface of the aromatic polyimide resin layer has a surface resistance in the range of 0.01 to $10^3$ ohms.

3. The aromatic polyimide film having a metallic surface as claimed in claim 1, wherein said aromatic polyimide resin layer contains the non-conductive metal oxide particles in an amount of 20 to 80% by weight.

4. The aromatic polyimide film having a metallic surface as claimed in claim 1, wherein said non-conductive metal oxide particles in the aromatic polyimide resin layer are particles of copper oxide, nickel oxide, cobalt oxide, lead oxide, cadmium oxide, chromium oxide, tin oxide or antimony oxide.

5. The aromatic polyimide film having a metallic surface as claimed in claim 1, wherein said metal layer is a layer made of metallic copper.

6. The aromatic polyimide film having a metallic surface as claimed in claim 1, wherein said aromatic polyimide of the substrate film is a polymer produced from an aromatic tetracarboxylic acid component and an aromatic diamine component.

7. The aromatic polyimide film having a metallic surface, as claimed in claim 6, wherein said surface of the aromatic polyimide resin layer has a surface resistance in the range of 0.01 to $10^3$ ohms.

8. The aromatic polyimide film having a metallic surface as claimed in claim 6, wherein said aromatic polyimide resin layer contains the non-conductive metal oxide particles in an amount of 20 to 80% by weight.

9. The aromatic polyimide film having a metallic surface as claimed in claim 8, wherein said non-conductive metal oxide particles in the aromatic polyimide resin layer are particles of copper oxide, nickel oxide, cobalt oxide, lead oxide, cadmium oxide, chromium oxide, tin oxide or antimony oxide.

10. The aromatic polyimide film having a metallic surface as claimed in claim 9, wherein said metal layer is a layer made of metallic copper.

11. The aromatic polyimide film having a metallic surface as claimed in claim 6, wherein said tetracarboxylic acid is 3,3',4,4'-biphenyltetracarboxylic acid, 2,2',3,3'-biphenyltetracarboxylic acid, 2,3,3',4'-biphenyltetracarboxylic acid, 3,3',4,4'-benzophenonetetracarboxylic acid, bis(3,4-dicarboxyphenyl)methane, 2,2-bis(3,4-dicarboxyphenyl)propane, bis(3,4-dicarboxyphenyl)thioether, bis(3,4-dicarboxyphenyl)sulfone, 2,3,6,7-naphthalenetetracarboxylic acid, or pyromellitic acid; and said aromatic diamine component is 4,4'-diaminodiphenyl ether, 4,4'-diaminodiphenylpropane, benzidine, 3,3'-dimethylbenzidine, 4,4'-diaminodiphenyl-sulfide, 4,4'-diaminodiphenylsulfone, methaphenylene-diamine, paraphenylenediamine, 3,3'-diaminodiphenyl-methane, 3,3'-diaminodiphenylpropane, 3,3'-diaminodiphenylsulfide, or 3,3'-diaminodiphenylsulfone.

12. The aromatic polyimide film having a metallic surface, as claimed in claim 11, wherein said surface of the aromatic polyimide resin layer has a surface resistance in the range of 0.01 to $10^3$ ohms.

13. The aromatic polyimide film having a metallic surface as claimed in claim 12, wherein said aromatic polyimide resin layer contains the non-conductive metal oxide particles in an amount of 20 to 80% by weight.

14. The aromatic polyimide film having a metallic surface as claimed in claim 13, wherein said non-conductive metal oxide particles in the aromatic polyimide resin layer are particles of copper oxide, nickel oxide, cobalt oxide, lead oxide, cadmium oxide, chromium oxide, tin oxide or antimony oxide.

15. The aromatic polyimide film having a metallic surface, as claimed in claim 13, wherein said surface of the aromatic polyimide resin layer has a surface resistance in the range of 0.01 to $10^3$ ohms.

* * * * *